United States Patent
Tang et al.

(10) Patent No.: US 8,891,290 B2
(45) Date of Patent: *Nov. 18, 2014

(54) METHOD AND SYSTEM FOR PROVIDING INVERTED DUAL MAGNETIC TUNNELING JUNCTION ELEMENTS

(75) Inventors: Xueti Tang, Fremont, CA (US); Jing Wu, San Jose, CA (US)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 865 days.

This patent is subject to a terminal disclaimer.

(21) Appl. No.: 13/045,528

(22) Filed: Mar. 11, 2011

(65) Prior Publication Data

US 2014/0063921 A1     Mar. 6, 2014

Related U.S. Application Data

(60) Provisional application No. 61/315,001, filed on Mar. 17, 2010.

(51) Int. Cl.
  *G11C 11/00*    (2006.01)
  *G11C 11/16*    (2006.01)
  *H01L 43/12*    (2006.01)

(52) U.S. Cl.
  CPC ............ *G11C 11/1675* (2013.01); *G11C 11/16* (2013.01); *H01L 43/12* (2013.01)
  USPC ............. 365/158; 365/55; 365/163; 365/171; 365/173; 365/180

(58) Field of Classification Search
  USPC ................. 365/55, 158, 163, 171, 173, 180
  See application file for complete search history.

(56) References Cited

U.S. PATENT DOCUMENTS

| | | | |
|---|---|---|---|
| 6,532,164 B2 | 3/2003 | Redon et al. | |
| 6,611,405 B1 | 8/2003 | Inomata et al. | |
| 6,958,927 B1 * | 10/2005 | Nguyen et al. | 365/158 |
| 6,967,863 B2 * | 11/2005 | Huai | 365/158 |
| 7,106,624 B2 * | 9/2006 | Huai et al. | 365/171 |
| 7,227,773 B1 | 6/2007 | Nguyen et al. | |
| 2002/0105827 A1 | 8/2002 | Redon et al. | |
| 2003/0007298 A1 | 1/2003 | Daughton et al. | |
| 2003/0059588 A1 | 3/2003 | Hannah et al. | |

(Continued)

OTHER PUBLICATIONS

Berger, "Emission of spin waves by a magnetic multilayer traversed by a current", Physical Review B, 54(13)9953-58 (1996).

(Continued)

*Primary Examiner* — Fernando Hidalgo
(74) *Attorney, Agent, or Firm* — Convergent Law Group LLP

(57) ABSTRACT

A method and system for providing a magnetic junction residing on a substrate and usable in a magnetic device are described. The magnetic junction includes a first pinned layer, a first nonmagnetic spacer layer having a first thickness, a free layer, a second nonmagnetic spacer layer having a second thickness greater than the first thickness, and a second pinned layer. The first nonmagnetic spacer layer resides between the pinned layer and the free layer. The first pinned layer resides between the free layer and the substrate. The second nonmagnetic spacer layer is between the free layer and the second pinned layer. Further, the magnetic junction is configured such that the free layer is switchable between a plurality of stable magnetic states when a write current is passed through the magnetic junction.

17 Claims, 7 Drawing Sheets

(56) References Cited

U.S. PATENT DOCUMENTS

| | | | |
|---|---|---|---|
| 2003/0227807 A1 | 12/2003 | Nakamura et al. | |
| 2005/0040433 A1 | 2/2005 | Nozieres et al. | |
| 2005/0104101 A1 | 5/2005 | Sun et al. | |
| 2005/0174702 A1 | 8/2005 | Gill | |
| 2006/0071287 A1 | 4/2006 | Yuasa et al. | |
| 2007/0111332 A1* | 5/2007 | Zhao et al. | 438/3 |

OTHER PUBLICATIONS

Katine, et al., "Current-Driven Magnetization Reversal and Spin-Wave Excitations in Co/Cu/Co Pillars", Physical Review Letters, 84(14):3149-52 (2000).

Nishimura, et al., "Magnetic tunnel junction device with perpendicular magnetization films for high-density magnetic random access memory", J. of Applied Physics, 90(8):5246-49 (2002).

Slonczewski, Conductance and exchange coupling of two ferromagnets separated by a tunneling barrier, Physical Review B, 39(10):6995-7002 (1989).

Slonczewski, "Current-driven excitation of magnetic multilayers", J. of Magnetism and Magnetic Materials, 159:L1-L7 (1996).

Slonczewski, "Theory and Application of Exchange-Driven Switching", IEEE, pp. CE-02 (2000).

PCT International Search Report and Written Opinion of the ISA, application No. PCT/US08/64794.

PCT International Search Report and Written Opinion of the ISA, application No. PCT/US08/66369.

PCT International Search Report and Written Opinion of the ISA, application No. PCT/US10/47941.

PCT International Search Report and Written Opinion of the ISA, application No. PCT/US10/59184.

Office Action issued Apr. 2008 for U.S. Appl. No. 11/239,939.

Office Action issued Sep. 2008 for U.S. Appl. No. 11/239,939.

Office Action issued Jan. 2010 for U.S. Appl. No. 12/133,671.

Office Action issued Apr. 2009 for U.S. Appl. No. 12/133,671.

Office Action issued Mar. 2011 for U.S. Appl. No. 12/638,902.

International Search Report for PCT/US11/28254 dated Dec. 2, 2011.

* cited by examiner

METHOD AND SYSTEM FOR PROVIDING INVERTED DUAL MAGNETIC TUNNELING JUNCTION ELEMENTS

CROSS-REFERENCE TO RELATED APPLICATIONS

This application claims the benefit of provisional Patent Application Ser. No. 61/315,001, filed Mar. 17, 2010, entitled METHOD AND SYSTEM FOR PROVIDING INVERTED DUAL MAGNETIC TUNNELING JUNCTION ELEMENTS, assigned to the assignee of the present application, and incorporated herein by reference.

GOVERNMENT RIGHTS

This invention was made with U.S. Government support under Grant/Contract No. HR0011-09-C-0023 awarded by DARPA. The U.S. Government retains certain rights in this invention.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-RAM). STT-RAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, FIG. 1 depicts a conventional magnetic tunneling junction (MTJ) 10 as it may be used in a conventional STT-RAM. The conventional MTJ 10 typically resides on a bottom contact 11, uses conventional seed layer(s) 12 and includes a conventional antiferromagnetic (AFM) layer 14, a conventional pinned layer 16, a conventional tunneling barrier layer 18, a conventional free layer 20, and a conventional capping layer 22. Also shown is top contact 24.

Conventional contacts 11 and 24 are used in driving the current in a current-perpendicular-to-plane (CPP) direction, or along the z-axis as shown in FIG. 1. The conventional seed layer(s) 12 are typically utilized to aid in the growth of subsequent layers, such as the AFM layer 14, having a desired crystal structure. The conventional tunneling barrier layer 18 is nonmagnetic and is, for example, a thin insulator such as MgO.

The conventional pinned layer 16 and the conventional free layer 20 are magnetic. The magnetization 17 of the conventional pinned layer 16 is fixed, or pinned, in a particular direction, typically by an exchange-bias interaction with the AFM layer 14. Although depicted as a simple (single) layer, the conventional pinned layer 16 may include multiple layers. For example, the conventional pinned layer 16 may be a synthetic antiferromagnetic (SAF) layer including magnetic layers antiferromagnetically coupled through thin conductive layers, such as Ru. In such a SAF, multiple magnetic layers interleaved with a thin layer of Ru may be used. In another embodiment, the coupling across the Ru layers can be ferromagnetic. Further, other versions of the conventional MTJ 10 might include an additional pinned layer (not shown) separated from the free layer 20 by an additional nonmagnetic barrier or conductive layer (not shown).

The conventional free layer 20 has a changeable magnetization 21. Although depicted as a simple layer, the conventional free layer 20 may also include multiple layers. For example, the conventional free layer 20 may be a synthetic layer including magnetic layers antiferromagnetically or ferromagnetically coupled through thin conductive layers, such as Ru. Although shown as in-plane, the magnetization 21 of the conventional free layer 20 may have a perpendicular anisotropy. Thus, the pinned layer 16 and free layer 20 may have their magnetizations 17 and 21, respectively oriented perpendicular to the plane of the layers.

To switch the magnetization 21 of the conventional free layer 20, a current is driven perpendicular to plane (in the z-direction). When a sufficient current is driven from the top contact 24 to the bottom contact 11, the magnetization 21 of the conventional free layer 20 may switch to be parallel to the magnetization 17 of the conventional pinned layer 16. When a sufficient current is driven from the bottom contact 11 to the top contact 24, the magnetization 21 of the free layer may switch to be antiparallel to that of the pinned layer 16. The differences in magnetic configurations correspond to different magnetoresistances and thus different logical states (e.g. a logical "0" and a logical "1") of the conventional MTJ 10.

When used in STT-RAM applications, the free layer 21 of the conventional MTJ 10 is desired to be switched at a relatively low current. The critical switching current ($I_{c0}$) is the lowest current at which the infinitesimal precession of free layer magnetization 21 around the equilibrium orientation becomes unstable. For example, $I_{c0}$ may be desired to be on the order of a few mA or less. In addition, a short current pulse is desired to be used in programming the conventional magnetic element 10 at higher data rates. For example, current pulses on the order of 20-30 ns or less are desired.

Although not shown, the conventional MTJ 10 could be a dual MTJ. In such a case, the conventional MTJ 10 would include an additional conventional barrier layer and an additional conventional pinned layer. The conventional free layer 20 would reside between the barrier layers. The additional barrier layer would be between the additional conventional pinned layer and the conventional free layer 20. In such a conventional dual MTJ, the conventional barrier layer 18 would typically be the same thickness as or thicker than the additional conventional barrier layer (not shown). Conventional dual MTJs generally have an improved switching current and symmetry, a smaller process margin, lower tunneling magnetoresistance (TMR), high resistance area product (RA), and a magnetic tunneling junction switching asymmetry that does not match the transistor supply current. In addition, a read disturbance for a normal layout may also occur.

Although the conventional MTJ 10 and a conventional dual MTJ may be written using spin transfer and used in an STT-RAM, there are drawbacks. For example, for conventional MTJs 10 having the magnetizations 17 and 21 oriented perpendicular, the magnetoresistance may be lower than a conventional MTJ 10 having its magnetization in-plane. Further, as discussed above, conventional dual MTJs may have a lower magnetoresistance than a single MTJ. As a result, the signal from the conventional MTJ 10 may be lower than desired. Such perpendicular conventional MTJs 10 also exhibit high damping. As such, switching performance is adversely affected. Thus, performance of a memory using the conventional MTJ 10 is still desired to be improved.

Accordingly, what is needed is a method and system that may improve the performance of the spin transfer torque based memories. The method and system described herein address such a need.

BRIEF SUMMARY OF THE INVENTION

A method and system for providing a magnetic junction residing on a substrate and usable in a magnetic device are described. The magnetic junction includes a first pinned layer, a first nonmagnetic spacer layer having a first thickness, a free layer, a second nonmagnetic spacer layer having a second thickness greater than the first thickness, and a second pinned layer. The first nonmagnetic spacer layer resides between the pinned layer and the free layer. The first pinned layer resides between the free layer and the substrate. The second nonmagnetic spacer layer is between the free layer and the second pinned layer. Further, the magnetic junction is configured such that the free layer is switchable between a plurality of stable magnetic states when a write current is passed through the magnetic junction.

DETAILED DESCRIPTION OF THE INVENTION

Figure 1:
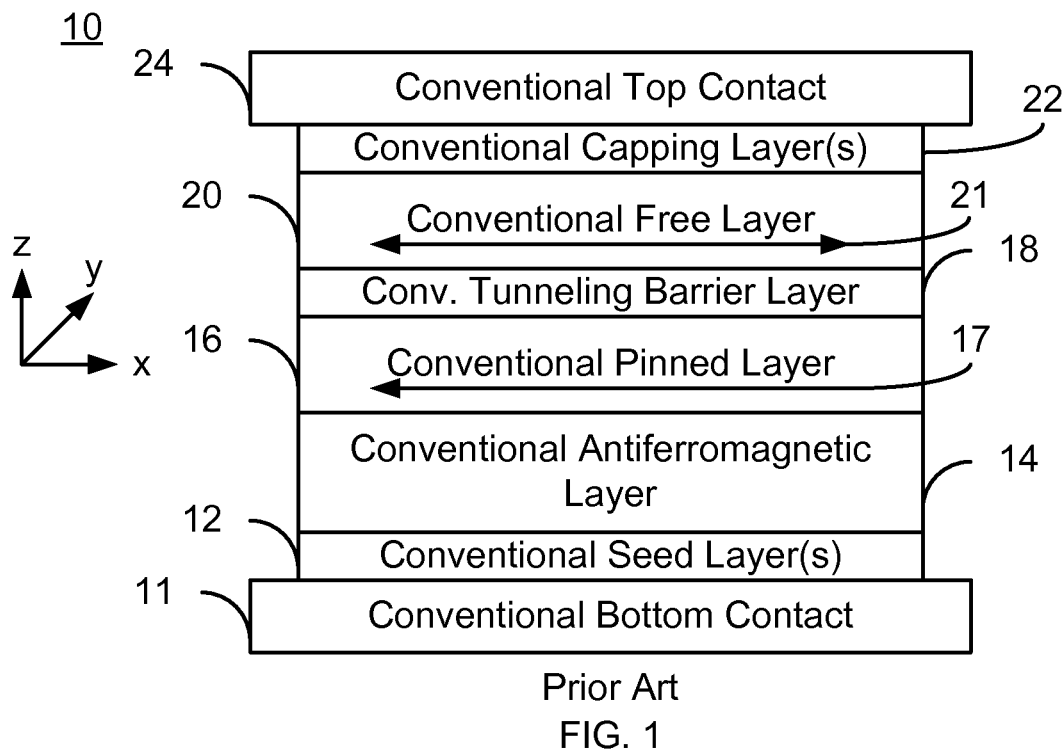
FIG. 1 depicts a conventional magnetic junction.

The exemplary embodiments relate to magnetic elements usable in magnetic devices, such as magnetic memories, and the devices using such magnetic elements. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

The exemplary embodiments are described in the context of particular magnetic elements having certain components. One of ordinary skill in the art will readily recognize that the present invention is consistent with the use of magnetic elements having other and/or additional components and/or other features not inconsistent with the present invention. The method and system are also described in the context of current understanding of the spin transfer phenomenon. Consequently, one of ordinary skill in the art will readily recognize that theoretical explanations of the behavior of the method and system are made based upon this current understanding of spin transfer. In addition, the method and system are described in the context of certain layers being synthetic and/or simple. However, one of ordinary skill in the art will readily recognize that the layers could have another structure. Furthermore, the method and system are described in the context of magnetic elements having particular layers. However, one of ordinary skill in the art will readily recognize that magnetic elements having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. The method and system are also described in the context of single elements. However, one of ordinary skill in the art will readily recognize that the method and system are consistent with the use of magnetic memories having multiple elements. Further, as used herein, "in-plane" is substantially within or parallel to the plane of one or more of the layers of a magnetic element. Conversely, "perpendicular" corresponds to a direction that is substantially perpendicular to one or more of the layers of the magnetic element.

A method and system for providing a magnetic junction residing on a substrate and usable in a magnetic device are described. The magnetic junction includes a first pinned layer, a first nonmagnetic spacer layer having a first thickness, a free layer, a second nonmagnetic spacer layer having a second thickness greater than the first thickness, and a second pinned layer. The first nonmagnetic spacer layer resides between the pinned layer and the free layer. The first pinned layer resides between the free layer and the substrate. The second nonmagnetic spacer layer is between the free layer and the second pinned layer. Further, the magnetic junction is configured such that the free layer is switchable between a plurality of stable magnetic states when a write current is passed through the magnetic junction.

Figure 2:
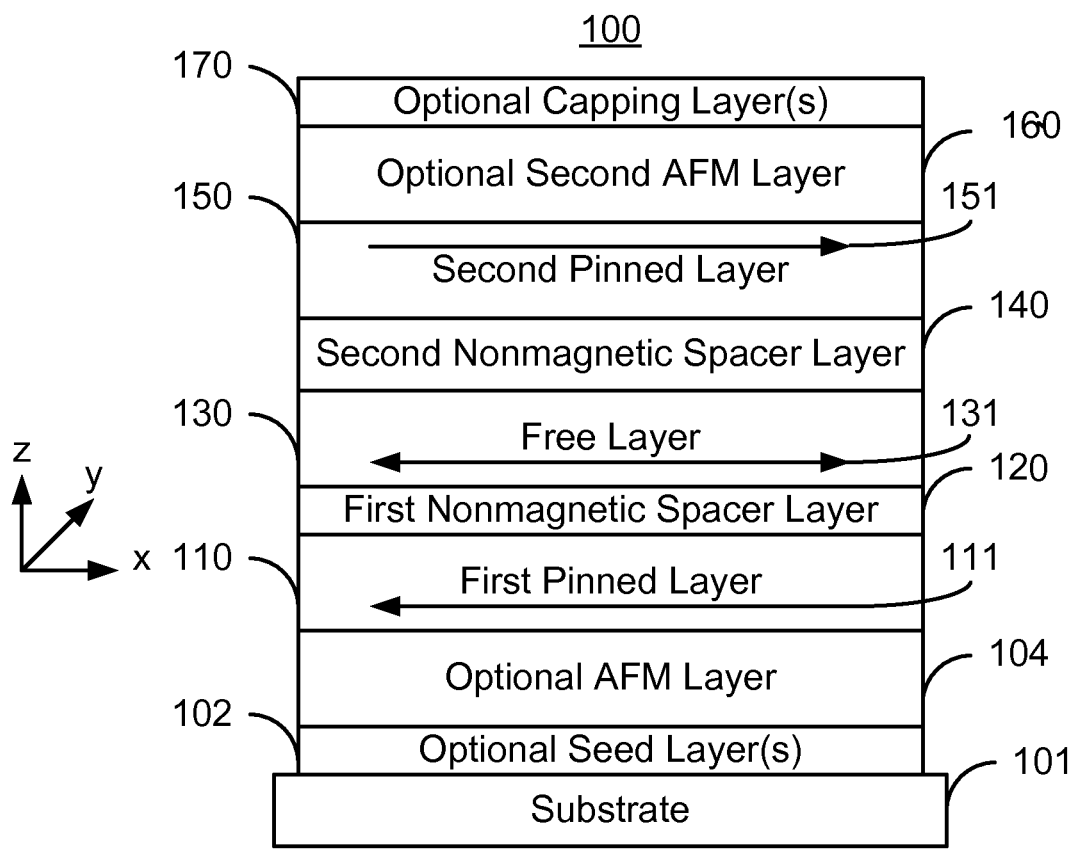
FIG. 2 depicts an exemplary embodiment of an inverted dual magnetic junction.

FIG. 2 depicts an exemplary embodiment of an inverted dual magnetic junction 100. The inverted dual magnetic junction 100 includes a first pinned layer 111 closest to the substrate 101, a first nonmagnetic spacer layer 120, a free layer 130, a second nonmagnetic spacer layer 140, and a second pinned layer 140. The pinned layers 110 and 150 have magnetizations 111 and 151, respectively. The free layer 130 is shown with magnetization 131. However, in other embodiments, the layers 110, 130, and/or 150 may have other magnetizations. The inverted dual magnetic junction 100 includes as the nonmagnetic spacer layers 120 and 140 tunneling barrier layers. However, in other embodiments, other nonmagnetic spacer layers 120 and 140 may be used. For example, conductive layers or granular layers having conductive channels or islands in an insulating matrix might be used in lieu of the barrier layers 120 and 140. This may be true of all embodiments described herein. However, for simplicity, only the magnetic junctions described herein are described in the context of inverted dual magnetic tunneling junctions (inverted dual MTJs) are described. The free layer 130 and the pinned layers 110 and 150 are generally ferromagnetic. However, one or more of the free layers 130 and pinned layers 110 and/or 150 may be multilayers including but not limited to synthetic antiferromagnets. In the embodiment shown, optional seed layer(s) 102 and/or optional capping layer(s) 170 may also be used. In some embodiments, for example, a Ta seed is provided. In the embodiment shown, optional AFM layers 104 and 160 are used. Such AFM layers 104 and 160 are used for each of the pinned layers 110 and 150, respectively. In some embodiments, the AFM layers 104 and/or 160 may use PtMn. In other embodiments, other mechanisms for pinning, or fixing in place, the magnetizations 111 and 151 of the pinned layers 110 and 150, respectively, may be used. The each of the pinned layers 110 and/or 150 may include materials such as CoFe, CoFeB, or a CoFeB/CoFe bilayer. The barrier layers/nonmagnetic spacer layers 120 and 140 may include materials such as MgO. The free layer 130 may include CoFeB or a doped CoFeB/CoFeB bilayer, CoFeB/CoFeB/CoFeB trilayer or CoFeB/nonmagnetic/CoFeB trilayer, or multilayers. For example, CoFeB may be doped with Cu, Ta, Cr, V and/or other elements and used for forming the free layer 130. However, other materials may be used for the layers of the inverted dual MTJ 100.

The inverted dual MTJ 100 is so termed because the top barrier layer 140 is the thicker barrier layer. The top/second barrier layer 140 is thicker than the bottom/first barrier layer 120. In some embodiments, the second nonmagnetic spacer/barrier layer 150 is at least 5% thicker than the first nonmagnetic spacer/barrier layer 120. In some such embodiments, the second nonmagnetic spacer/barrier layer 140 is not more than 40% thicker than the first nonmagnetic spacer/barrier layer 120. For example, the second nonmagnetic spacer/barrier layer 140 might be 0.05 through 0.5 nanometer thicker than the thin nonmagnetic spacer/barrier layer 120. In other embodiments, the second nonmagnetic spacer/barrier layer 140 is not more than 30% thicker than the first nonmagnetic spacer/barrier layer 120. For example, the second nonmagnetic spacer/barrier layer 140 might be 0.05 through 0.3 nanometer thicker than the thin nonmagnetic spacer/barrier layer 120. Further, as seen in FIG. 1, the thicker nonmagnetic spacer/barrier layer 140 is further from the substrate than the thin nonmagnetic spacer/barrier layer 120.

It had been expected that the use of a thicker nonmagnetic spacer/barrier layer 140 further from the substrate would not alter performance of the inverted dual MTJ. However, the inverted dual magnetic junction 100 may have a higher magnetoresistance than an analogous conventional dual MTJ. For example, in some embodiments, the inverted dual MTJ 100 might have a TMR on the order of 50%-200% at room temperature (e.g. 23° Celsius). In other embodiments, the inverted dual MTJ 100 may have TMR of greater than 100% or perhaps higher at room temperature (e.g. 23° Celsius). In comparison, analogous conventional dual MTJs would have a TMR on the order of 50%-100%. Thus, the TMR may at least double in some embodiments. As a result, the inverted dual MTJ 100 may have many of the benefits of a conventional dual MTJ, while producing a higher signal.

Figure 3:
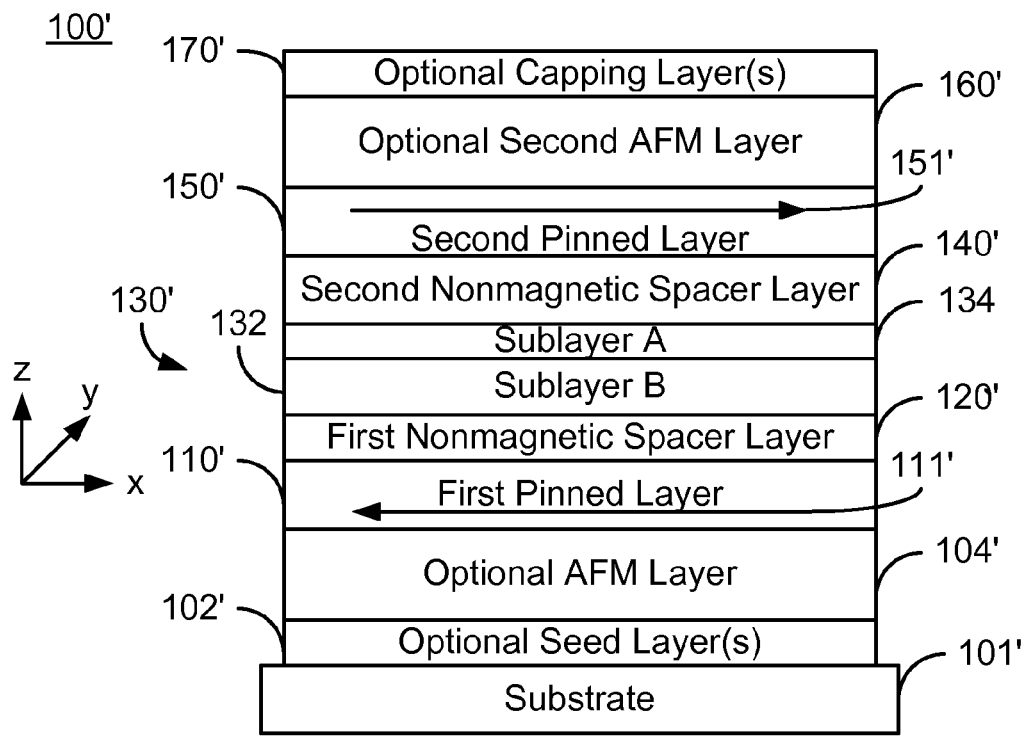
FIG. 3 depicts another exemplary embodiment of an inverted dual magnetic junction.

FIG. 3 depicts another exemplary embodiment of an inverted dual MTJ 100' having a thin nonmagnetic spacer/barrier layer 120' and a thicker nonmagnetic spacer/barrier layer 150' further from the substrate 101' than the thin nonmagnetic spacer/barrier layer 120. Portions of the inverted dual magnetic junction 100' are analogous to those in the inverted dual magnetic junction 100 depicted in FIG. 2. Analogous portions are labeled similarly. Thus, the magnetic junction 100' includes a first pinned layer 110' having magnetization 111', a first nonmagnetic spacer layer 120', a free layer 130', a second nonmagnetic spacer layer 140', and second pinned layer 150' having magnetization 151' that are analogous to the first pinned layer 110 having magnetization 111, the first nonmagnetic spacer layer 120, the free layer 130, the second nonmagnetic spacer layer 140, and the second pinned layer 150', respectively. Also shown are optional AFM layers 104' and 160' as well as optional seed layer 102' and optional capping layer 170' that are analogous to layers 104, 160, 102, and 170, respectively. The structure and function of the layers 102', 104', 110', 120', 130', 140', 150', 160' and 170' are analogous to layers 102, 104, 110, 120, 130, 140, 150, 160, and 170, respectively. In the embodiment shown, the free layer 130' is multilayer including multiple sublayers. In the embodiment depicted, only two sublayers 132 and 134 are shown. However, another number of sublayers may be used. Sublayer B 132 may include CoFeB doped with Cu, Ta, Cr, V and other elements, while sublayer A 134 may include CoFeB. In another embodiment, the free layer 130' may include additional layers that may or may not be magnetic. For example, the free layer 130' may be a synthetic layer including at magnetic layers interleaved with one or more nonmagnetic layers.

Figure 4:
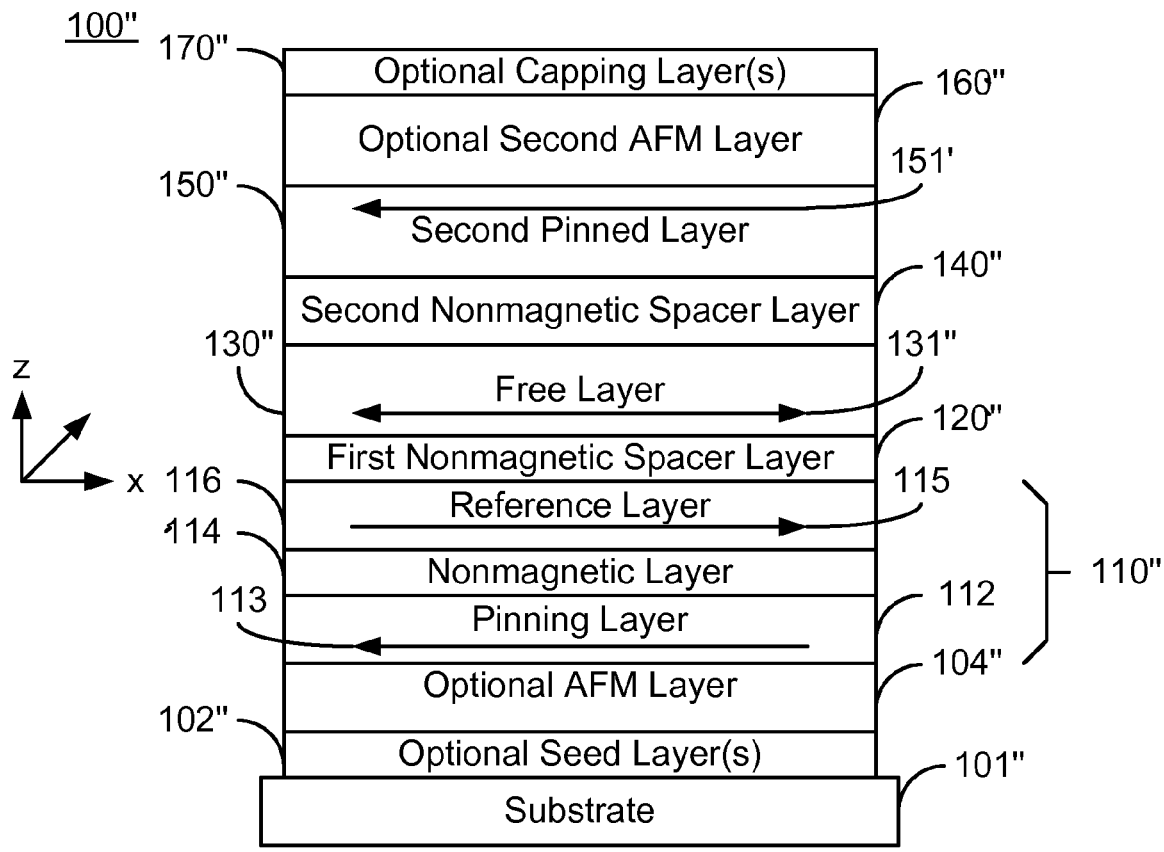
FIG. 4 depicts another exemplary embodiment of an inverted dual magnetic junction.

FIG. 4 depicts another embodiment of an inverted dual magnetic junction 100" having a thin nonmagnetic spacer/barrier layer 120" and a thicker nonmagnetic spacer/barrier layer 140" further from the substrate 101" than the thin nonmagnetic spacer/barrier layer 120". Portions of the inverted dual magnetic junction 100" are analogous to those in the inverted dual magnetic junctions 100 and 100'. Analogous portions are labeled similarly. Thus, the magnetic junction 100" includes a first pinned layer 110", a first nonmagnetic spacer layer 120", a free layer 130", a second nonmagnetic spacer layer 140", and second pinned layer 150" having magnetization 151" that are analogous to the first pinned layer 110/110', the first nonmagnetic spacer layer 120/120', the free layer 130/130', the second nonmagnetic spacer layer 140/140', and the second pinned layer 150/150' having magnetization 151/151', respectively. Also shown are optional AFM layers 104" and 160" as well as optional seed layer 102" and optional capping layer 170" that are analogous to layers 104/104', 160/160', 102/102', and 170/170', respectively. The structure and function of the layers 102", 104", 110", 120", 130", 140", 150", 160" and 170" are analogous to layers 102/102', 104/104', 110/110', 120/120', 130/130', 140/140', 150/150', 160/160', and 170/170', respectively. In the embodiment shown in FIG. 4, the first pinned layer 110" includes a pinned, or reference, layer 116 having magnetization 115 and a pinning layer 112 having magnetization 113, each of which is ferromagnetic. The pinned layer 112 and reference layer 116 are separated by nonmagnetic layer 114. For example, pinning layer 112 may include CoFe, while the reference layer 116 may include CoFeB or a CoFe/CoFeB bilayer. Note that although only the first pinned layer 110" is depicted as including multiple layers, the second pinned layer 150" or both the first pinned layer 110" and the second pinned layer 150" may include multiple layers such as the reference layer 116 and pinning layer 112.

Figure 5:
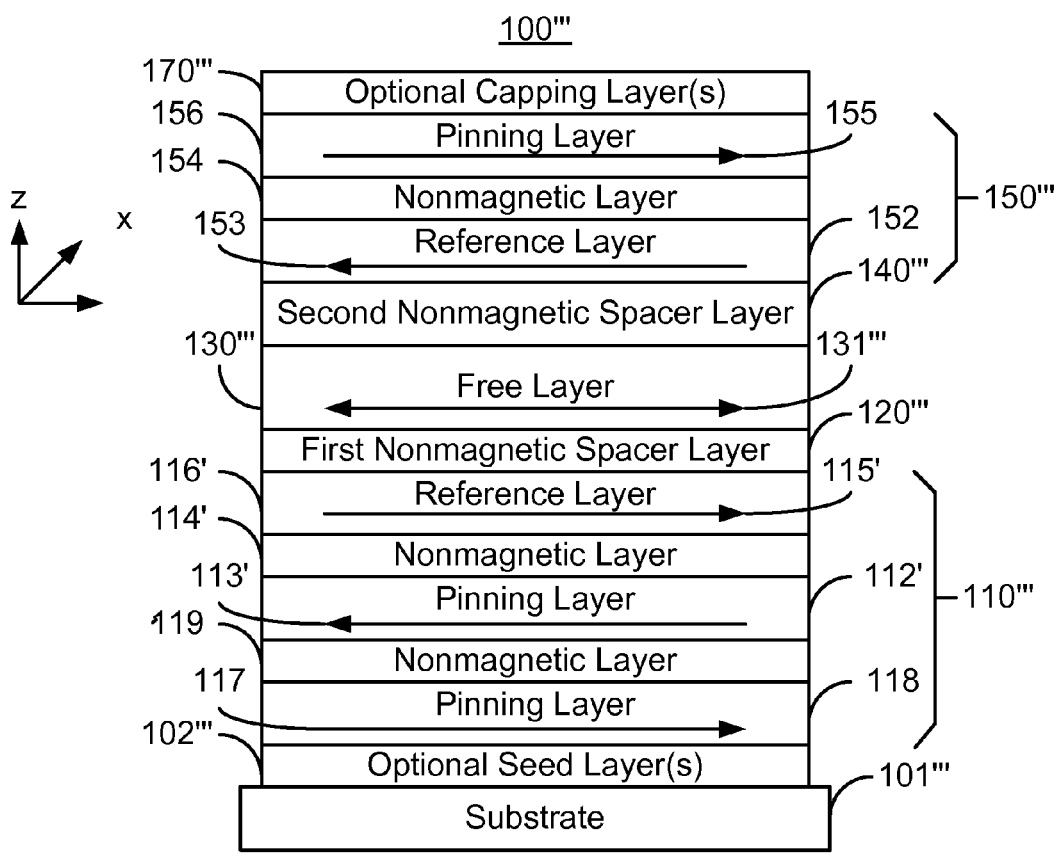
FIG. 5 depicts another exemplary embodiment of an inverted dual magnetic junction.

FIG. 5 depicts another embodiment of an inverted dual magnetic junction 100''' having a thin nonmagnetic spacer/barrier layer 120''' and a thicker nonmagnetic spacer/barrier layer 140''' further from the substrate 101''' than the thin nonmagnetic spacer/barrier layer 140'''. Portions of the inverted dual magnetic junction 100''' are analogous to those in the inverted dual magnetic junctions 100, 100', and 100". Analogous portions are labeled similarly. Thus, the magnetic junction 100''' includes a first pinned layer 110''', a first nonmagnetic spacer layer 120''', a free layer 130''', a second nonmagnetic spacer layer 140''', and second pinned layer 150''' that are analogous to the first pinned layer 110/110'/110", the first nonmagnetic spacer layer 120/120'/120", the free layer 130/130'/130", the second nonmagnetic spacer layer 140/140'/140", and the second pinned layer 150/150'/150", respectively. Also shown are optional AFM layers 104''' and 160''' as well as optional seed layer 102''' and optional capping layer 170''' that are analogous to layers 104/104'/104", 160/160'/160", 102/102'/102", and 170/170'/170", respectively. The structure and function of the layers 102''', 104''', 110''', 120''', 130''', 140''', 150''', 160''' and 170''' are analogous to layers 102/102'/102", 104/104'/104", 110/110'/110", 120/120'/120", 130/130'/130", 140/140'/140", 150/150'/150", 160/160'/160", and 170/170'/170", respectively. In the embodiment shown, the first pinned layer 110''' and the second pinned layer 150''' both include multiple layers. The second pinned layer 150" is a synthetic layer including pinning layer 156 having magnetization 155, nonmagnetic layer 154, and reference layer 152 having magnetization 153. Further, the first pinned layer 110''' includes two pinning layers 112' and 118 having magnetizations 113' and 117, respectively, as well as reference layer 116' with magnetization 115'.

Figure 6:
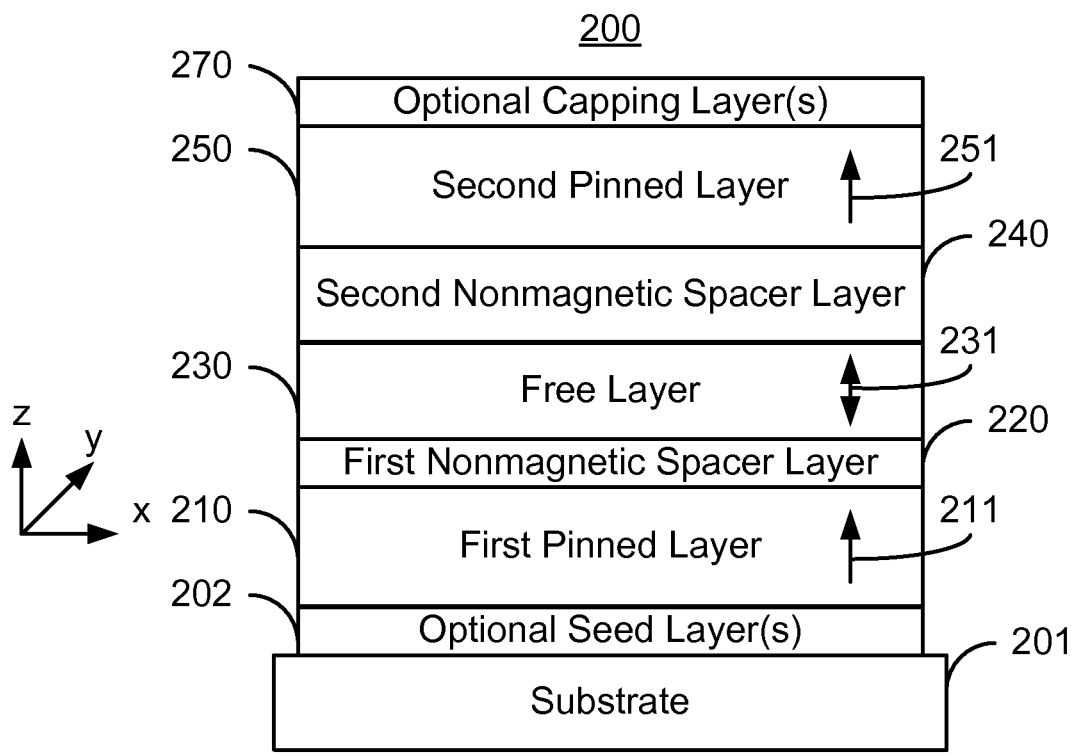
FIG. 6 depicts another exemplary embodiment of an inverted dual magnetic junction.

FIG. 6 depicts another embodiment of an inverted dual magnetic junction 200 having a thin nonmagnetic spacer/barrier layer 220 and a thicker nonmagnetic spacer/barrier layer 240 further from the substrate than the thin nonmagnetic spacer/barrier layer 220. Portions of the inverted dual magnetic junction 200 are analogous to those in the inverted dual magnetic junctions 100, 100', 100", and 100'''. Analogous portions are labeled similarly. Thus, the magnetic junction 200 includes a first pinned layer 210, a first nonmagnetic spacer layer 220, a free layer 230, a second nonmagnetic spacer layer 240, and second pinned layer 250 that are analogous to the first pinned layer 110/110'/110"/110''', the first nonmagnetic spacer layer 120/120'/120"/120''', the free layer 130/130'/130"/130''', the second nonmagnetic spacer layer 140/140'/140"/140''', and the second pinned layer 150/150'/150"/150''', respectively. Although not shown, optional AFM layers adjoining one or more of the pinned layer 210 and 250 may be provided. Also shown are optional seed layer 202 on substrate 201 and optional capping layer 270 that are analogous to layers 102/102'/102"/102''' and 170/170'/170", respectively. The structure and function of the layers 202, 204, 210, 220, 230, 240, 250, 260 and 270 are analogous to layers 102/102'/102"/102''', 104/104'/104"/104''', 110/110'/110"/110''', 120/120'/120"/120''', 130/130'/130"/130''', 140/140'/140"/140''', 150/150'/150"/150''', 160/160'/160"/160''', and 170/170'/170"/170''', respectively. In the embodiment shown, the magnetizations 211, 231, and 251 are perpendicular-to-plane. Although the magnetizations 211, 231, and 251 are shown as having components only perpendicular-to-plane in FIG. 6, and only in plane in FIGS. 1-5, a mixture of perpendicular-to-plane and in-plane may be used. Further, although layers 210, 220, and 230 are shown as simple layers, multilayers including synthetic antiferromagnets may be used.

Figure 7:
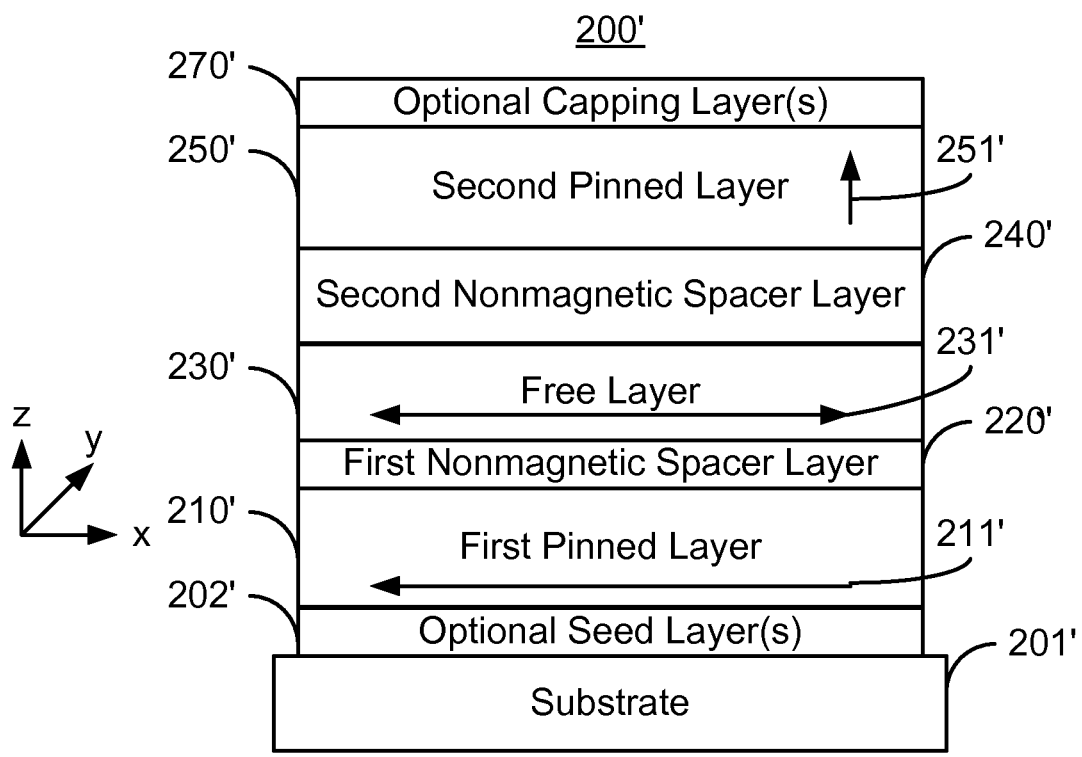
FIG. 7 depicts another exemplary embodiment of an inverted dual magnetic junction.

FIG. 7 depicts another embodiment of inverted dual magnetic junctions 200' having a thin nonmagnetic spacer/barrier layer 220' and a thicker nonmagnetic spacer/barrier layer 240' further from the substrate than the thin nonmagnetic spacer/barrier layer 220'. Portions of the inverted dual magnetic junction 200' are analogous to those in the inverted dual magnetic junction 200. Analogous portions are labeled similarly. Thus, the magnetic junction 200' includes a first pinned layer 210', a first nonmagnetic spacer layer 220', a free layer 230', a second nonmagnetic spacer layer 240', and second pinned layer 250' that are analogous to the first pinned layer 210, the first nonmagnetic spacer layer 220, the free layer 230, the second nonmagnetic spacer layer 240, and the second pinned layer 250, respectively. Although not shown, optional AFM layers adjoining one or more of the pinned layer 210' and 250' may be provided. Also shown are optional seed layer 202' on substrate 201' and optional capping layer 270' that are analogous to layers 202 and 270, respectively. The structure and function of the layers 202', 204', 210', 220', 230', 240', 250', 260' and 270' are analogous to layers 202, 204, 210, 220, 230, 240, 250, 260, and 270, respectively. In the embodiment shown, the magnetizations of some layers are perpendicular-to-plane, while others are in plane. The magnetizations 211' and 251' of the pinned layers 210' and 250' are also perpendicular to each other. In particular, in FIG. 7, the second pinned layer 250' has a magnetization that is perpendicular-to-plane, while the first pinned layer 210' has a magnetization that is in-plane. In another embodiment, the free layer 230' may have a magnetization 231' perpendicular-to-plane instead of in-plane as is shown. Although the magnetizations are shown as having components only perpendicular-to-plane or only in-plane in FIG. 7, a mixture of perpendicular-to-plane and in-plane may be used for a particular layer. Further, although layers 210', 220', and 230' are shown as simple layers, multilayers including synthetic antiferromagnets may be used.

Figure 8:
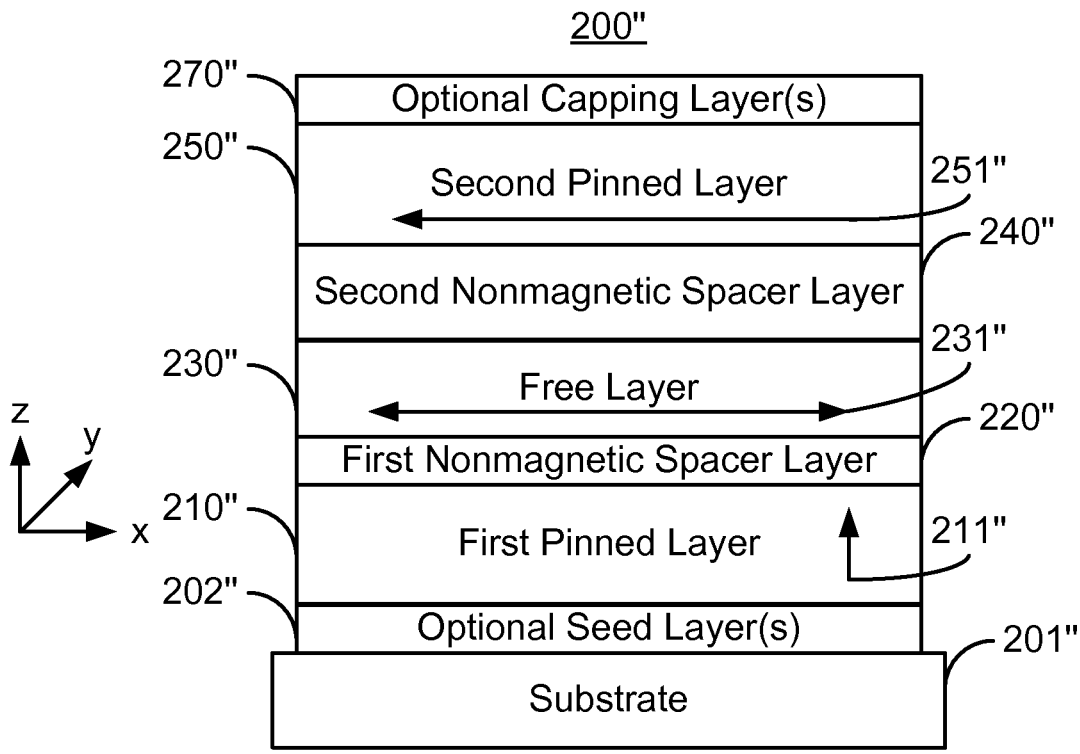
FIG. 8 depicts another exemplary embodiment of an inverted dual magnetic junction.

FIG. 8 depicts another embodiment of inverted dual magnetic junctions 200" having a thin nonmagnetic spacer/barrier layer 220" and a thicker nonmagnetic spacer/barrier layer 240" further from the substrate than the thin nonmagnetic spacer/barrier layer 220". Portions of the inverted dual magnetic junction 200" are analogous to those in the inverted dual magnetic junctions 200 and 200'. Analogous portions are labeled similarly. Thus, the magnetic junction 200" includes a first pinned layer 210", a first nonmagnetic spacer layer 220", a free layer 230", a second nonmagnetic spacer layer 240", and second pinned layer 250" that are analogous to the first pinned layer 210/210', the first nonmagnetic spacer layer 220/220', the free layer 230/230', the second nonmagnetic spacer layer 240/240', and the second pinned layer 250/250', respectively. Although not shown, optional AFM layers adjoining one or more of the pinned layer 210" and 250" may be provided. Also shown are optional seed layer 202" on substrate 201" and optional capping layer 270" that are analogous to layers 202/202' and 270/270', respectively. The structure and function of the layers 202", 204", 210", 220", 230", 240", 250", 260" and 270" are analogous to layers 202/202', 204/204', 210/210', 220/220', 230/230', 240/240', 250/250', 260/260', and 270/270', respectively. In the embodiment shown, the magnetizations of some layers are perpendicular-to-plane, while others are in plane. The magnetizations 211" and 251" of the pinned layers 210" and 250" are also perpendicular to each other. In particular, in FIG. 8, the second pinned layer 250" has a magnetization that is in-plane, while the first pinned layer 210" has a magnetization that is perpendicular-to-plane. In another embodiment, the free layer 230" may have a magnetization 231" perpendicular-to-plane instead of in-plane as is shown. Although the magnetizations are shown as having components only perpendicular-to-plane or only in-plane in FIG. 8, a mixture of perpendicular-to-plane and in-plane may be used for a particular layer. Further, although layers 210", 220", and 230" are shown as simple layers, multilayers including synthetic antiferromagnets may be used.

Figure 9:
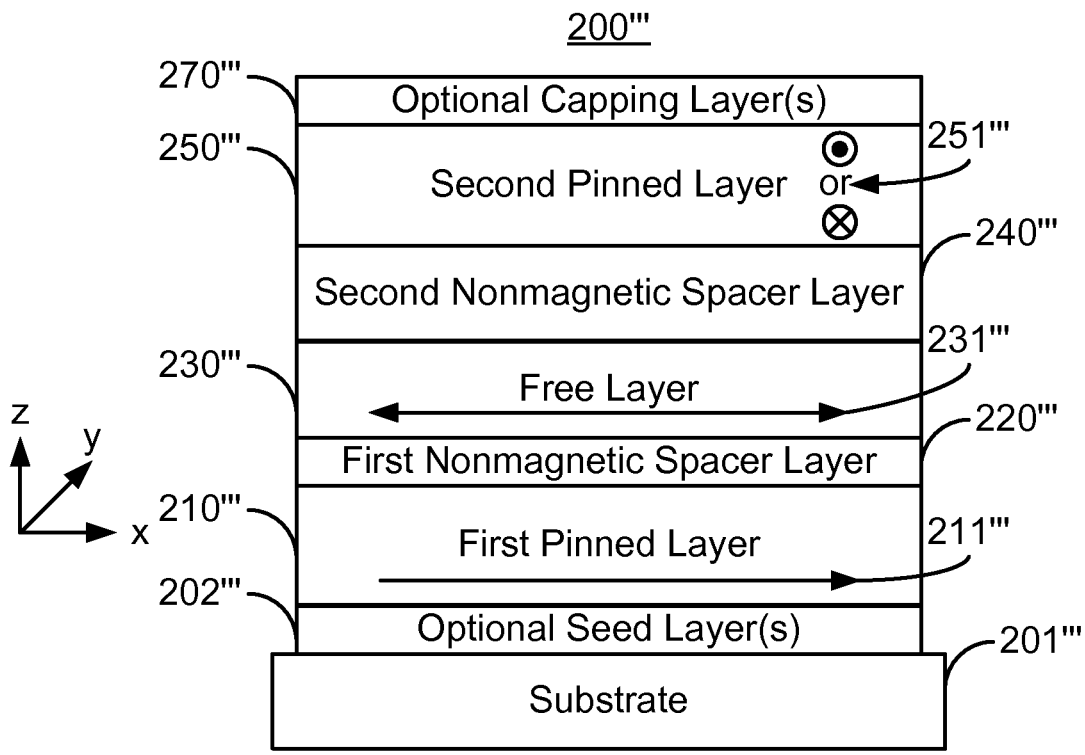
FIG. 9 depicts another exemplary embodiment of an inverted dual magnetic junction.

FIG. 9 depicts another embodiment of an inverted dual magnetic junction 200''' having a thin nonmagnetic spacer/barrier layer 220''' and a thicker nonmagnetic spacer/barrier layer 240''' further from the substrate 201" than the thin nonmagnetic spacer/barrier layer 220". Portions of the inverted dual magnetic junction 200''' are analogous to those in the inverted dual magnetic junctions 200, 200', and 200". Analogous portions are labeled similarly. Thus, the magnetic junction 200''' includes a first pinned layer 210''', a first nonmagnetic spacer layer 220''', a free layer 230''', a second nonmagnetic spacer layer 240''', and second pinned layer 250''' that are analogous to the first pinned layer 210/210'/210", the first nonmagnetic spacer layer 220/220'/220", the free layer 230/230'/230", the second nonmagnetic spacer layer 240/240'/240", and the second pinned layer 250/250'/250", respectively. Although not shown, optional AFM layers adjoining one or more of the pinned layer 210''' and 250''' may be provided. Also shown are optional seed layer 202''' on substrate 201''' and optional capping layer 270''' that are analogous to layers 202/202'/202" and 270/270'/270", respectively. The structure and function of the layers 202''', 204''', 210''', 220''', 230''', 240''', 250''', 260''' and 270''' are analogous to layers 202/202'/202", 204/204'/204", 210/210'/210", 220/220'/220", 230/230'/230", 240/240'/240", 250/250'/250", 260/260'/260", and 270/270'/270", respectively. In the embodiment shown, the magnetizations 211''' and 251''' of the pinned layers 210''' and 250''' also perpendicular to each other. However, both magnetizations 211''' and 251''' are in plane. The magnetization 251''', which may be either into our out of the plane of the page in FIG. 9, is also perpendicular to the easy axis of the free layer 230'''. Although layers 210''', 220''', and 230''' are shown as simple layers, multilayers including synthetic antiferromagnets may be used.

Figure 10:
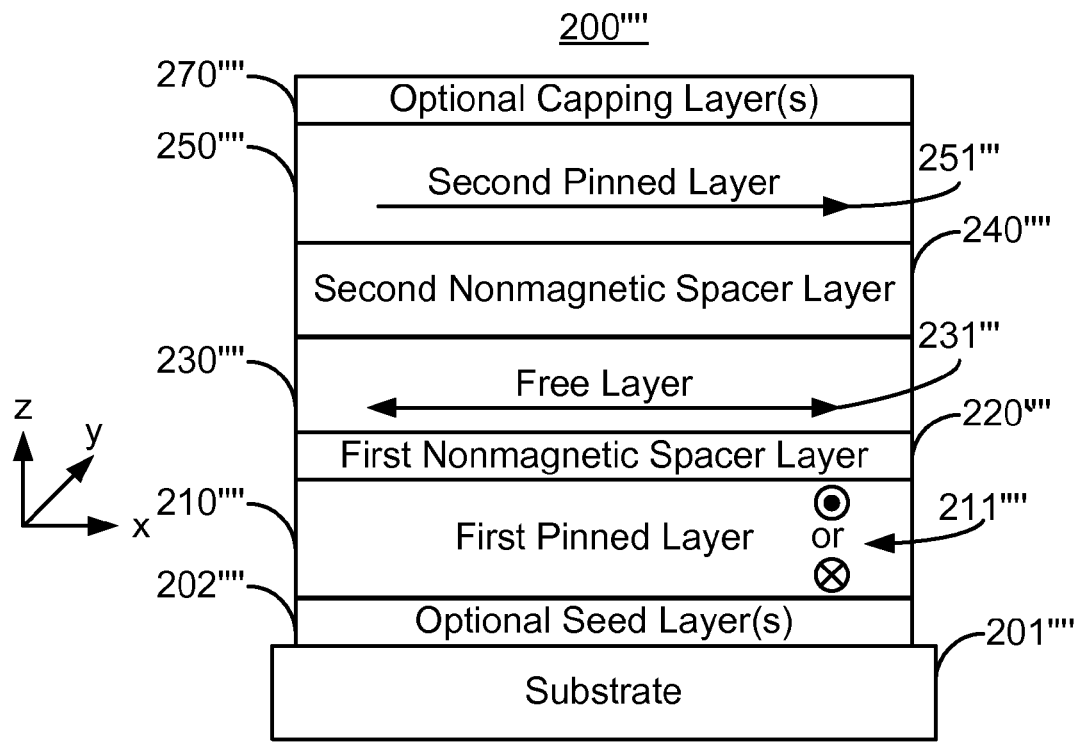
FIG. 10 depicts another exemplary embodiment of an inverted dual magnetic junction.

FIG. 10 depicts another embodiment of an inverted dual magnetic junction 200'''' having a thin nonmagnetic spacer/barrier layer 220'''' and a thicker nonmagnetic spacer/barrier layer 240'''' further from the substrate 201" than the thin nonmagnetic spacer/barrier layer 220'''. Portions of the inverted dual magnetic junction 200'''' are analogous to those in the inverted dual magnetic junctions 200, 200', 200" and 200'''. Analogous portions are labeled similarly. Thus, the magnetic junction 200'''' includes a first pinned layer 210'''', a first nonmagnetic spacer layer 220'''', a free layer 230'''', a second nonmagnetic spacer layer 240'''', and second pinned layer 250'''' that are analogous to the first pinned layer 210/210'/210"/210''', the first nonmagnetic spacer layer 220/220'/220"/220''', the free layer 230/230'/230"/230''', the second nonmagnetic spacer layer 240/240'/240"/240''', and the second pinned layer 250/250'/250"/250''', respectively. Although not shown, optional AFM layers adjoining one or more of the pinned layer 210'''' and 250'''' may be provided. Also shown are optional seed layer 202'''' on substrate 201'''' and optional capping layer 270'''' that are analogous to layers 202/202'/202"/202''' and 270/270'/270"/270''', respectively. The structure and function of the layers 202'''', 204'''', 210'''', 220'''', 230'''', 240'''', 250'''', 260'''' and 270'''' are analogous to layers 202/202'/202"/202''', 204/204'/204"/204''', 210/210'/210"/210''', 220/220'/220"/220''', 230/230'/230"/230''', 240/240'/240"/240''', 250/250'/250"/250''', 260/260'/260"/260''', and 270/270'/270"/270''', respectively. In the embodiment shown, the magnetizations 211'''' and 251'''' of the pinned layers 210'''' and 250'''' also perpendicular to each other. However, both magnetizations 211'''' and 251'''' are in plane. The magnetization 211''', which may be either into our out of the plane of the page in FIG. 10, is also perpendicular to the easy axis of the free layer 230''''. Although layers 210'''', 220'''', and 230'''' are shown as simple layers, multilayers including synthetic antiferromagnetics may be used.

The inverted dual magnetic junctions 100', 100", 100''', 200, 200', 200", 200''', and 200'''' of FIGS. 3-10 share at least some of the benefits of the inverted dual magnetic junction 100 of FIG. 2. In particular, the magnetoresistance ration, or TMR for barrier layers, may be increased significantly. It may also be noted that the free layer may be engineered such that the top side (thicker barrier layer further from the substrate) has a higher TMR than the bottom side (thinner barrier layer closer to the substrate). In addition, the second pinned layer and thicker barrier are desired to be engineered to have a higher TMR than the first pinned layer and the thinner barrier layer closer to the substrate. For example, the use of a CoFeB (doped)/CoFeB bilayer free layer, MgO barrier layers having the thicknesses described above, and a CoFeB or CoFeB/CoFe bilayer as the second pinned layer may be desired.

Figure 11:
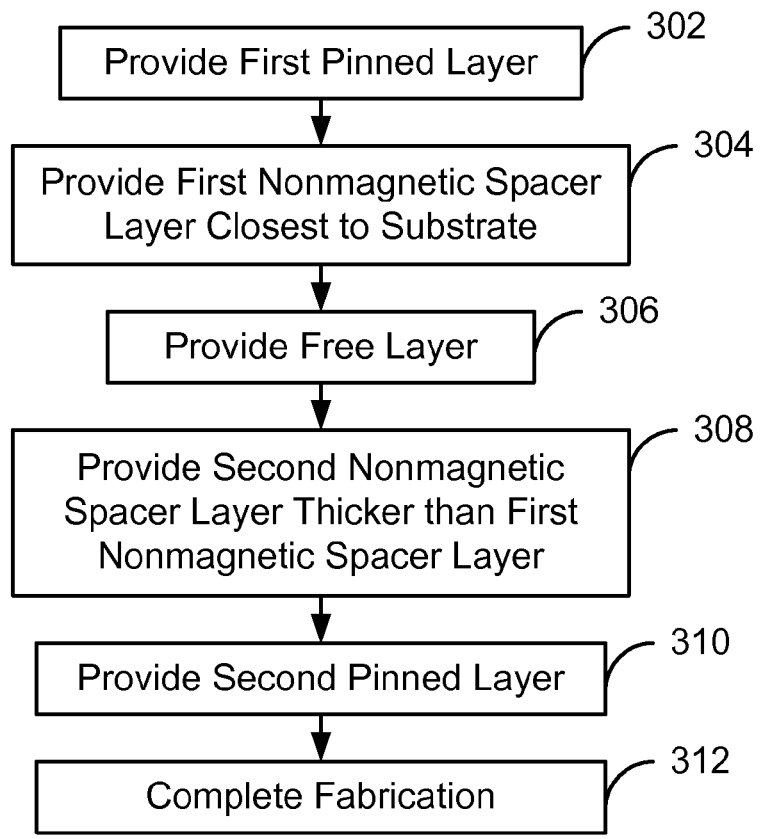
FIG. 11 depicts an exemplary embodiment of a method for providing an exemplary embodiment of an inverted dual magnetic junction.

FIG. 11 depicts an exemplary embodiment of a method 300 for fabricating an inverted dual magnetic junction. For simplicity, some steps may be omitted, combined, or interleaved. The method 300 is described in the context of the magnetic junction 100. However, the method 310 may be used on other magnetic junctions such as the junctions 100, 100', 100", 100''', 200, 200', 200", 200''', and/or 200''''. Further, the method 300 may be incorporated into fabrication of magnetic memories. Thus the method 300 may be used in manufacturing a STT-RAM or other magnetic memory. The method 300 may commence after the seed layer(s) 102 and optional AFM layer 104 are provided.

The pinned layer 110 is provided, via step 302. Step 302 may include depositing the desired materials at the desired thickness of the pinned layer 110. Further, step 302 may include providing a SAF.

The nonmagnetic spacer/barrier layer 120 is provided, via step 304. Step 304 may include depositing the desired nonmagnetic materials, including but not limited to crystalline MgO. In addition, the desired thickness of material may be deposited in step 304.

The free layer 130 is provided, via step 306. An additional nonmagnetic spacer/barrier layer, such as layer 140 may be provided, via step 308. Step 308 includes providing a sufficient thickness for the nonmagnetic spacer/barrier layer 140 such that the layer 140 is thicker than the layer 120. In some embodiments, step 308 includes depositing a layer of crystalline MgO that is thicker than the layer 120.

An additional pinned layer, such as the layer 150 is provided, via step 310. Fabrication may then be completed, via step 312. For example, the antiferromagnetic layer 160 and/or the capping layer 170 may be provided. In some embodiments, in which the layers of the magnetic junction are deposited as a stack, then defined, step 312 may include defining the magnetic junction 100, performing anneals, or otherwise completing fabrication of the magnetic junction 100. Further, if the magnetic junction 100 is incorporated into a memory, such as an STT-RAM, step 312 may include providing contacts, bias structures, and other portions of the memory. Consequently, the benefits of the magnetic junction may be achieved.

Figure 12:
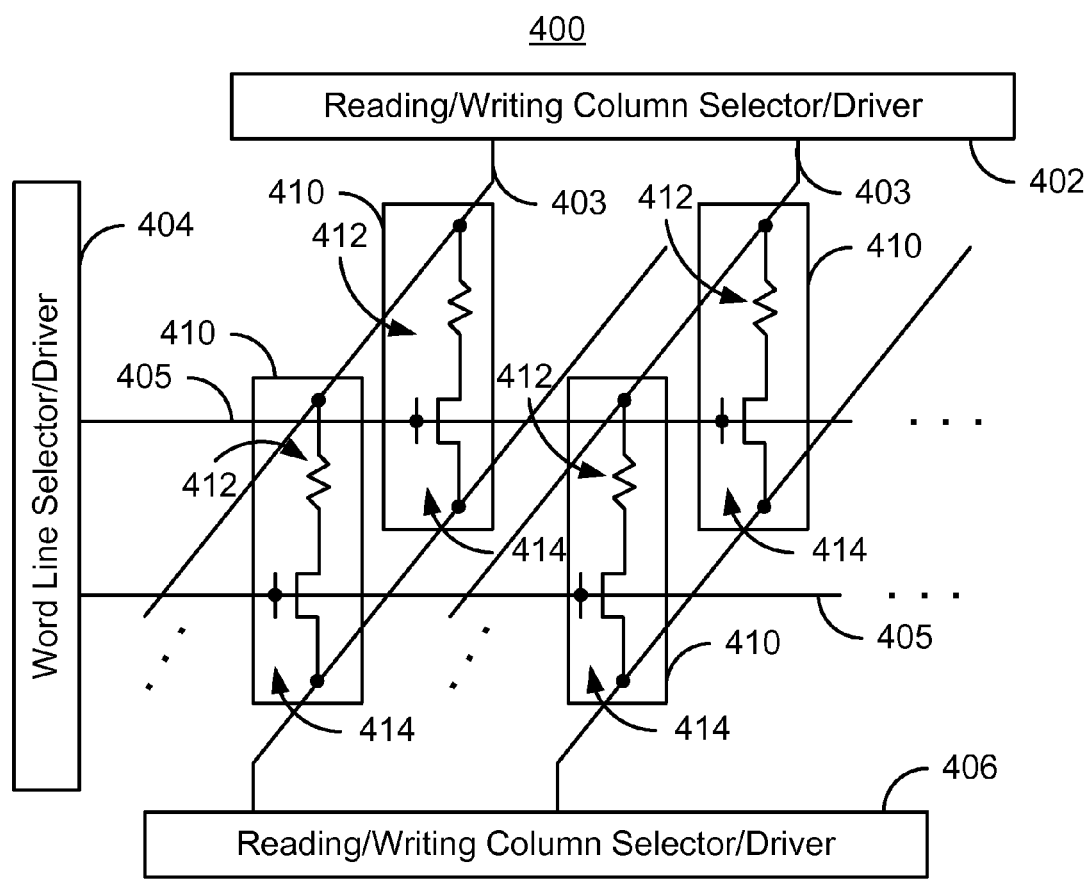
FIG. 12 depicts an exemplary embodiment of a memory utilizing inverted dual magnetic junctions.

Further, the magnetic junctions 100, 100', 100'', 100''', 200, 200', 200'', 200''' and/or 200'''' may be used in a magnetic memory. FIG. 12 depicts an exemplary embodiment of one such memory 400. The magnetic memory 400 includes reading/writing column select drivers 402 and 406 as well as word line select driver 404. Note that other and/or different components may be provided. The storage region of the memory 400 includes magnetic storage cells 410. Each magnetic storage cell includes at least one magnetic junction 412 and at least one selection device 414. In some embodiments, the selection device 414 is a transistor. The magnetic junctions 412 may be one of the magnetic junctions 100, 100', 100'', 100''', 200, 200', 200'', 200''' and/or 200''''. Although one magnetic junction 412 is shown per cell 410, in other embodiments, another number of magnetic junctions 412 may be provided per cell. As such, the magnetic memory 400 may enjoy the benefits described above, such as a higher signal.

Various dual inverted magnetic junctions 100, 100', 100'', 100''', 200, 200', 200'', 200''' and 200'''' have been disclosed. Note that various features of the dual inverted junctions 100, 100', 100'', 100''', 200, 200', 200'', 200''' and 200'''' may be combined. Thus, one or more of the benefits of the magnetic junctions 100, 100', 100'', 100''', 200, 200', 200'', 200''' and 200'''' such as improved signal, may be achieved.

A method and system for providing an inverted dual magnetic junction that might be used magnetic memory element, for example, in spin transfer torque based memories, and memory fabricated using the magnetic memory element has been described. The method and system have been described in accordance with the exemplary embodiments shown, and one of ordinary skill in the art will readily recognize that there could be variations to the embodiments, and any variations would be within the spirit and scope of the method and system. For example, various combinations including features of one or more of the dual inverted MTJs shown in FIGS. 2-10 may be used. Further, although barrier layers are described, other nonmagnetic spacer layers might be used. Accordingly, many modifications may be made by one of ordinary skill in the art without departing from the spirit and scope of the appended claims.

We claim:

1. A magnetic junction residing on a substrate and for use in a magnetic device comprising:
   a first pinned layer;
   a first nonmagnetic spacer layer having a first thickness;
   a free layer, the first nonmagnetic spacer layer residing between the pinned layer and the free layer, the first pinned layer residing between the free layer and the substrate;
   a second nonmagnetic spacer layer having a second thickness greater than the first thickness, the first nonmagnetic spacer layer and the second nonmagnetic spacer layer being both insulating tunneling barrier layers; and
   a second pinned layer, the second nonmagnetic spacer layer residing between the free layer and the second pinned layer;
   wherein the magnetic junction is configured such that the free layer is switchable between a plurality of stable magnetic states when a write current is passed through the magnetic junction.

2. The magnetic junction of claim 1 wherein the second thickness is at least five percent greater than the first thickness.

3. The magnetic junction of claim 2 wherein the second thickness is not more than forty percent greater than the first thickness.

4. The magnetic junction of claim 1 wherein the second thickness is 0.05 through 0.5 nanometer greater than the first thickness.

5. The magnetic junction of claim 1 wherein the magnetic junction is characterized by a magnetoresistance ratio of greater than one hundred percent.

6. The magnetic junction of claim 1 wherein the at least one of the first nonmagnetic spacer layer and the second nonmagnetic spacer layer include MgO.

7. The magnetic junction of claim 1 wherein the free layer has a free layer magnetization substantially perpendicular to a plane of the free layer.

8. The magnetic junction of claim 7 wherein at least one of the first pinned layer and the second pinned layer includes a pinned layer magnetization substantially perpendicular to a pinned layer plane.

9. The magnetic junction of claim 1 wherein at least one of the first pinned layer, the second pinned layer, and the free layer is a synthetic layer.

10. The magnetic junction of claim 1 further comprising:
    a first antiferromagnetic layer adjoining the first pinned layer; and
    a second antiferromagnetic layer adjoining the second pinned layer.

11. A magnetic memory residing on a substrate and comprising:
    a plurality of magnetic storage cells, each of the plurality of magnetic storage cells including at least one magnetic junction, the at least one magnetic junction including a first pinned layer, a first nonmagnetic spacer layer, a free layer, a second nonmagnetic spacer layer, and a second pinned layer, the first nonmagnetic spacer layer residing between the first pinned layer and the free layer, the second nonmagnetic spacer layer residing between the second pinned layer and the free layer, the first pinned layer residing between the free layer and the substrate, the first nonmagnetic spacer layer having a first thickness, the second nonmagnetic spacer having a second thickness greater than the first thickness, the magnetic junction being configured such that the free layer is switchable between a plurality of stable magnetic states when a write current is passed through the magnetic junction, the first nonmagnetic spacer layer and the second nonmagnetic spacer layer being both insulating tunneling barrier layers; and
    a plurality of bit lines.

12. The magnetic memory of claim 11 wherein the second thickness is at least five percent greater than the first thickness and not more than forty percent greater than the first thickness.

13. The magnetic memory of claim 11 wherein the magnetic junction is characterized by a magnetoresistance ratio of greater than one hundred percent.

14. The magnetic memory of claim 11 wherein the free layer has a free layer magnetization substantially perpendicular to a plane of the free layer.

15. The magnetic memory of claim 14 wherein at least one of the first pinned layer and the second pinned layer includes a pinned layer magnetization substantially perpendicular to a pinned layer plane.

16. The magnetic memory of claim 11 wherein at least one of the first pinned layer, the second pinned layer, and the free layer is a multilayer.

17. A method for providing a magnetic junction residing on a substrate for use in a magnetic device comprising:
providing a first pinned layer;
providing a first nonmagnetic spacer layer having a first thickness;
providing a free layer, the first nonmagnetic spacer layer residing between the pinned layer and the free layer, the first pinned layer residing between the free layer and the substrate;
providing a second nonmagnetic spacer layer having a second thickness greater than the first thickness, the first nonmagnetic spacer layer and the second nonmagnetic spacer layer being both insulating tunneling barrier layers; and
providing a second pinned layer, the second nonmagnetic spacer layer residing between the free layer and the second pinned layer;
wherein the magnetic junction is configured such that the free layer is switchable between a plurality of stable magnetic states when a write current is passed through the magnetic junction.

* * * * *